US012527194B2

(12) United States Patent
Lee et al.

(10) Patent No.: US 12,527,194 B2
(45) Date of Patent: Jan. 13, 2026

(54) LIGHT EMITTING DISPLAY DEVICE

(71) Applicant: LG DISPLAY CO., LTD., Seoul (KR)

(72) Inventors: Seung-Bum Lee, Paju-si (KR);
Seung-Cheol You, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 555 days.

(21) Appl. No.: 17/962,855

(22) Filed: Oct. 10, 2022

(65) Prior Publication Data

US 2023/0209961 A1    Jun. 29, 2023

(30) Foreign Application Priority Data

Dec. 27, 2021    (KR) .......................... 10-2021-0188232

(51) Int. Cl.
*H10K 59/38*    (2023.01)
*H10K 59/121*    (2023.01)
*H10K 59/122*    (2023.01)
*H10K 59/35*    (2023.01)

(52) U.S. Cl.
CPC .......... *H10K 59/38* (2023.02); *H10K 59/122* (2023.02); *H10K 59/351* (2023.02); *H10K 59/353* (2023.02)

(58) Field of Classification Search
CPC .... H10K 59/38; H10K 59/122; H10K 59/351; H10K 59/353; H10K 59/121; H10K 59/35
See application file for complete search history.

(56) References Cited

U.S. PATENT DOCUMENTS

| 9,515,285 | B2* | 12/2016 | Sato ..................... H10H 29/142 |
| 10,141,379 | B2* | 11/2018 | Kim .................... H10K 59/8791 |
| 10,373,978 | B2* | 8/2019 | Lee ....................... H10H 20/835 |
| 10,651,427 | B2* | 5/2020 | Youn ...................... H10K 50/11 |
| 11,183,669 | B2* | 11/2021 | Lim ..................... H10K 59/879 |
| 11,289,546 | B2* | 3/2022 | Ryu ..................... H10K 50/816 |
| 11,744,114 | B2* | 8/2023 | Baek ................... H01L 25/0753 |
|  |  |  | 257/40 |

(Continued)

FOREIGN PATENT DOCUMENTS

| KR | 10-2017-0062904 A | 6/2017 |
| KR | 10-2019-0036107 A | 4/2019 |

(Continued)

OTHER PUBLICATIONS

Office Action in Korean Appln. No. 10-2021-0188232, mailed on Jul. 5, 2025, 14 pages (with English translation).

*Primary Examiner* — Eduardo A Rodela
(74) *Attorney, Agent, or Firm* — Fish & Richardson P.C.

(57) ABSTRACT

A light emitting display device includes a first color conversion pattern with a first color conversion material located correspondingly to an emitting area of a first sub-pixel, and optionally a second color conversion pattern with a second color conversion material located correspondingly to an emitting area of a second sub-pixel, and a while light emitted from an electro-luminescence element can be converted to a red light and a green color light in the first and second sub-pixels, respectively, and thus, the device can implement red light and green light with improved color purity and light efficiency. It is possible to maximize out-coupling efficiency of light emitted from the electro-luminescence element and to improve a color purity and light efficiency of the device.

20 Claims, 5 Drawing Sheets

(56) References Cited

U.S. PATENT DOCUMENTS

| | | | |
|---|---|---|---|
| 11,963,421 B2* | 4/2024 | Lin | H10K 59/35 |
| 2006/0152151 A1* | 7/2006 | Seo | H10K 59/38 |
| | | | 313/506 |
| 2014/0008618 A1* | 1/2014 | Lim | H10K 50/858 |
| | | | 438/23 |
| 2015/0200234 A1* | 7/2015 | Kim | H10K 50/856 |
| | | | 257/40 |
| 2015/0331161 A1* | 11/2015 | Wang | G02B 5/201 |
| | | | 430/7 |
| 2019/0067642 A1* | 2/2019 | Kim | H10K 50/858 |
| 2019/0181189 A1* | 6/2019 | Chang | H10K 59/351 |
| 2020/0212120 A1* | 7/2020 | Yang | H10K 59/38 |
| 2022/0181391 A1* | 6/2022 | Park | H10K 59/38 |

FOREIGN PATENT DOCUMENTS

| | | | |
|---|---|---|---|
| KR | 20190069285 A | 6/2019 |
| KR | 20210086157 A | 7/2021 |

* cited by examiner

LIGHT EMITTING DISPLAY DEVICE

CROSS-REFERENCE TO RELATED APPLICATION

This application claims the priority of Korean Patent Application No. 10-2021-0188232, filed on Dec. 27, 2021, which is hereby incorporated by reference in its entirety.

BACKGROUND

Field of the Disclosure

The present disclosure relates to a light emitting display device, and more specifically, to a light emitting display device having improved color purity and optical efficiency.

Description of the Background

As information technology has progressed, various display devices have been applied to various fields. Among those display devices, an organic light emitting diode (OLED) display device, which is also referred to as an organic electroluminescent display device, or a quantum-dot light emitting diode (QLED) includes an electro-luminescence (EL) element in which charges are injected into an emissive layer disposed between a cathode as an electron injection electrode and an anode as a hole injection electrode and holes and electrons are recombined in the emissive layer so as to emit light. Such an OLED or QLED display device can be formed on a flexible substrate such as plastics, implement high contrast ratio due to self-luminous type and live images easily owing to shout response time of several micro seconds. There is no restriction in the view angle in the OLED or QLED display device. In addition, the OLED or QLED display device is stable even at low temperature and can be driven with a relatively low voltage of about 5 V to about 15 V of DC, so it is easy to manufacture and design a driving circuit.

In the OLED or QLED display device, a pixel includes a red sub-pixel, a green sub-pixel and a blue sub-pixel. Each of the sub-pixels includes an EL element each of which emits red light, green light and blue light, respectively, and therefore, the display device displays images combining the lights emitted from each sub-pixel.

In this case, each emissive layer emitting red light, green light and blue light, respectively, includes emitting materials different from each other and having different properties. Accordingly, each of the red sub-pixel and the green sub-pixel and the blue sub-pixel has different luminous efficiency and luminous lifetime from each other. To solve those problems, an OLED or QLED display device into which a color filter is applied has been developed.

In the display device including the color filter, a pixel includes a red sub-pixel, a green sub-pixel and a blue sub-pixel each of which includes an electro-luminescence element emitting white light, respectively. Each of the red, green and blue sub-pixels includes a red color filter, a green color filter and a blue color filter, respectively, so that the white light emitted from the electro-luminescence element disposed in each sub-pixel converts a red light, a green light and blue light with transmitting each of the red, green and blue color filters, respectively, and thereby, the display device can display images combining the red, green and blue lights. In this case, it is necessary of color matching between the white light emitted from the electro-luminescence element and the color filters in order to implement precise colors.

The color filter has been widely used in a liquid crystal display (LCD) device. However, the white light emitting from a light source in the LCD device differs from the white light emitting from the electro-luminescence element in the OLED or QLED display device in that the peak positions and band widths of the red, green and blue lights. Accordingly, when the color filter used in the LCD device is applied to the electro-luminescence display device, the electro-luminescence display device has a problem of lowering color gamut or color reproduction ranges. In addition, the color filter absorbing different colors with different wavelength ranges results in lowering optical efficiency of the display device.

SUMMARY

Accordingly, the present disclosure is directed to a light emitting display device that substantially obviates one or more of the problems due to the limitations and disadvantages of the related art.

More specifically, the present disclosure is to provide a light emitting display device that improves color gamut and optical efficiency thereof.

Additional features and aspects will be set forth in the description that follows, and in part will be apparent from the description, or can be learned by practice of the inventive concepts provided herein. Other features and aspects of the inventive concept can be realized and attained by the structure particularly pointed out in the written description, or derivable therefrom, and the claims hereof as well as the appended drawings.

To achieve these and other aspects of the inventive concepts, as embodied and broadly described, the present disclosure provides a light emitting display device that includes a substrate defining a first sub-pixel, a second sub-pixel and a third sub-pixel each of which includes an emitting area and a non-emitting area; a first electrode disposed over the substrate; a bank covering an edgy of the first electrode and disposed along a periphery of the emitting area; a first color conversion pattern located correspondingly to the emitting area of the first sub-pixel; an emissive layer disposed over the bank and the first color conversion pattern; and a second electrode disposed over the emissive layer, wherein the first color conversion pattern is arranged in a transmission direction of a light emitted from the emissive layer in the first sub-pixel and converts a first color light among the light emitted from the emissive layer in the first sub-pixel to a second color light.

The first color conversion pattern may be arranged in a grid shape in the emitting area of the first sub-pixel and/or may be further disposed along a periphery or an edge of the emitting area of the first sub-pixel. Optionally, the first color conversion pattern may be extended from the bank.

For example, the first color conversion pattern may have an area of about 5% to about 15% of the emitting area of the first sub-pixel and/or may have a thickness of about 0.5 um to about 1.5 um.

Alternatively, the first color conversion pattern may have a width of about 1 um to about 3 um.

Optionally, the first sub-pixel may further include a first color filter pattern which may be a red color filter pattern.

The first color light may be at least one of a blue light and a green light and the second color light may be a red light.

The emissive layer emits a white light and the white light emitted from the emissive layer and the red light are incident to the red color filter Optionally, the light emitting display device may further include a second color conversion pattern located correspondingly to the emitting area of the second sub-pixel.

The second color conversion pattern may be located in a transmission direction of a light emitted from the emissive layer in the second sub-pixel and/or the second color conversion pattern may convert the first color light emitted from the emissive layer of the second sub-pixel to a third color light.

The second sub-pixel further includes a second color filter pattern which may include a green color filter pattern.

The first color light may be a blue light and the third color light may be a green light The emissive layer in the second sub-pixel may emit a white light and the white light emitted from the emissive layer in the second sub-pixel and the green light may be incident to the green color filter pattern.

Alternatively, the first color conversion pattern may include an inclined surface changing a propagation path of the light emitted from the emissive layer in the first sub-pixel when the light is incident to the first color conversion pattern.

The inclined surface may have an inclination angle greater than 0 degrees and less than 40 degrees.

Alternatively, the bank may include a trench.

At least one color conversion pattern corresponding to at least one sub-pixel is disposed in the light emitting display device, and thus, out-coupling efficiency emitted from an emissive layer of an electro luminescence element can be enhanced.

In addition, as blue light among white light emitted from the emissive layer is converted into red light and/or green light, it is possible to implement red light and green light with improved color purity and luminous efficiency.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this disclosure, illustrate aspects of the disclosure and together with the description serve to explain principles of the disclosure.

In the drawings.

DETAILED DESCRIPTION

Reference will now be made in detail to aspects of the disclosure, examples of which are illustrated in the accompanying drawings.

Figure 1:
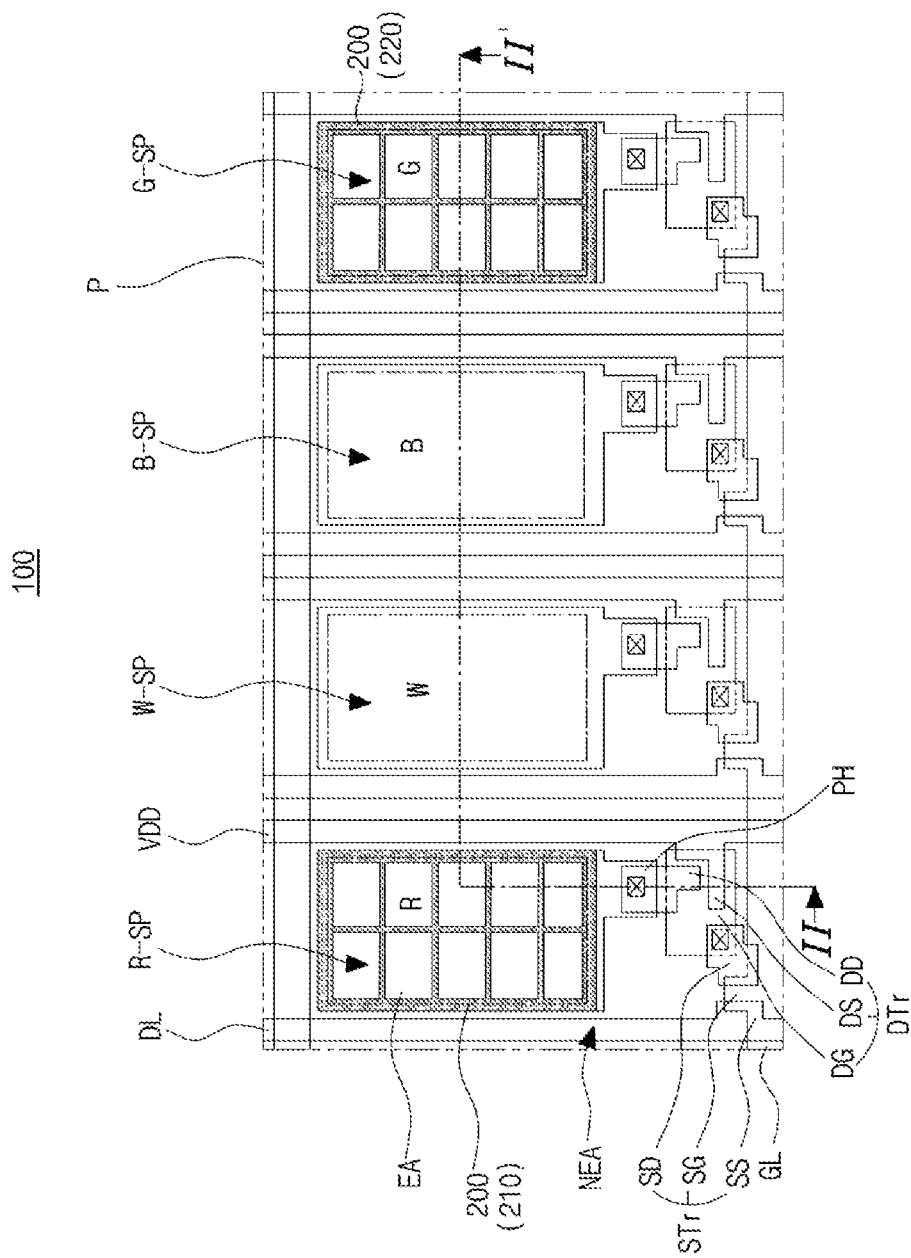
FIG. 1 is a schematic plain view illustrating a plurality of sub-pixels in a light emitting display device in accordance with an exemplary aspect of the present disclosure.

FIG. 1 is a schematic plain view illustrating a plurality of sub-pixels in a light emitting display device in accordance with an exemplary aspect of the present disclosure. As illustrated in FIG. 1, a light emitting display device 100 in accordance with an exemplary aspect of the present disclosure includes a unit pixel P that includes a first sub-pixel R-SP, a second sub-pixel G-SP and a third sub-pixel B-SP. The first sub-pixel R-SP may be a red sub-pixel, the second sub-pixel G-SP may be a green sub-pixel and the third sub-pixel B-SP may be a blue sub-pixel. Each of the first to third sub-pixels R-SP, G-SP and B-SP includes an emitting area EA and a non-emitting area NEA, respectively. A bank 119 (shown in FIG. 2) is arranged along a periphery of each non-emitting area EA to define the non-emitting area NEA.

The red, green and blue sub-pixels R-SP, G-SP and B-SP may be arranged alternatively in the vertical direction, and each of a plurality of the red, green and blue sub-pixels R-SP, G-SP and B-SP may be arranged in the horizontal direction, respectively. Accordingly, each of the red, green and blue sub-pixels R-SP, G-SP and B-SP may have a structure arranged in a stripe shape.

In addition, the unit pixel P may further a fourth sub-pixel W-SP that may be a white sub-pixel. The unit pixel P including the red, white, blue and green sub-pixels R-SP, W-SP, B-SP and G-SP may have a tetragon structure. While each of the sub-pixels R-SP, W-SP, B-SP and G-SP with the same width is arranged in parallel in FIG. 1, each of the sub-pixels R-SP, W-SP, B-SP and G-SP may have various structures having different widths one another.

A switching and driving thin film transistors STr and DTr are arranged in the non-emitting area NEA in each of the sub-pixels R-SP, W-SP, B-SP and G-SP, and an electro-luminescence element, or light emitting diode E (shown in FIG. 2) is arranged in the emitting area EA in each of the sub-pixels R-SP, W-SP, B-SP and G-SP. The electro-luminescence element E (shown in FIG. 2) may comprises, but is not limited to, an organic light emitting diode (OLED) and a quantum light emitting diode (QLED). The electro-luminescence element E may include a first electrode 111 (shown in FIG. 2), an emissive layer 113 (shown in FIG. 2) and a second electrode 115 (shown in FIG. 2). The first electrode 111 may be an anode electrode and the second electrode 115 may be a cathode electrode. The switching thin film transistor STr and the driving thin film transistor DTr are connected to each other, and the driving thin film transistor DTr is connected to the electro-luminescence element E (shown in FIG. 2).

More particularly, a gate line GL, a data line DL and a power line VDD are arranged over a substrate 101 (shown in FIG. 2) to define each of the sub-pixels R-SP, W-SP, B-SP and G-SP. The switching thin film transistor STr are formed in a region where the gate line GL and the data line DL intersect, and the switching thin film transistor STr functions to select each of the sub-pixels R-SP, W-SP, B-SP and G-SP. The switching thin film transistor STr includes a gate electrode SG extended from the gate line GL, a semiconductor layer, a source electrode SS and a drain electrode SD.

The driving thin film transistor DTr acts to drive the electro-luminescence element E in each of the sub-pixels R-SP, W-SP, B-SP and G-SP selected by the switching thin film transistor STr. The driving thin film transistor DTr includes a gate electrode DG connected to the drain electrode SD of the switching thin film transistor STr, a semiconductor layer 103 (shown in FIG. 2), a source electrode DS connected to the power line VDD and a drain electrode DD. The drain electrode DD of the driving thin film transistor DTr is connected to the first electrode 111 (shown in FIG. 2) of the electro-luminescence element E (shown in FIG. 2).

Figure 2:
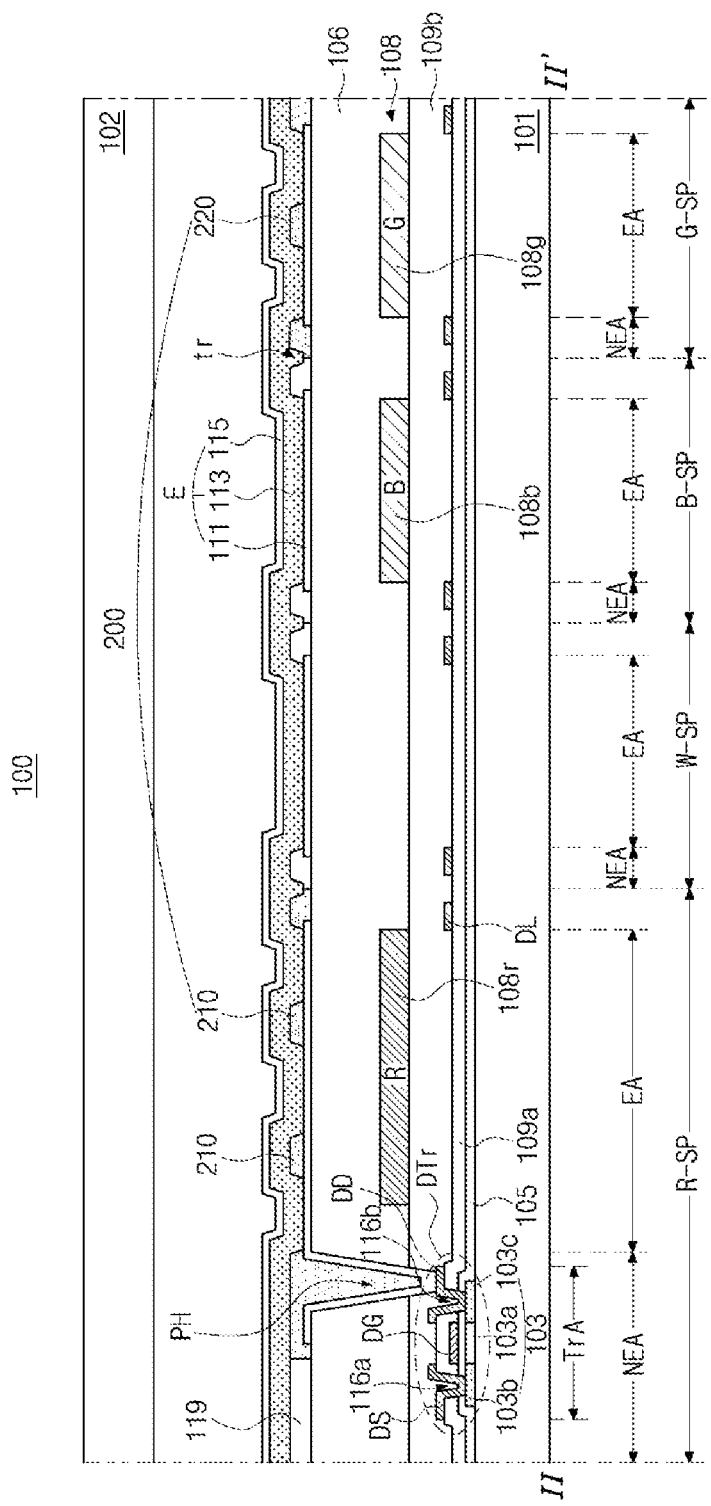
FIG. 2 is a cross-sectional view taken along the line II-II' of FIG. 1 and illustrating the structure of a unit pixel including four sub-pixels in the light emitting display device in accordance with an exemplary aspect of the present disclosure.

The emissive layer 113 (shown FIG. 2), which emits white light, is disposed between the first electrode 111 (shown in FIG. 2) and the second electrode 115 (shown in FIG. 2) of the electro-luminescence element E (shown in FIG. 2).

A color filter layer 108 (shown in FIG. 2) is disposed correspondingly to a transmission direction of the white light emitted from the emissive layer (shown in FIG. 2). The color filter layer 108 (shown in FIG. 2) includes a first color filter pattern 108r (shown in FIG. 2), a second color filter pattern 108g (shown in FIG. 2) and a third color filter pattern 108b (shown in FIG. 2). The first color filter pattern 108r (shown in FIG. 2) may be disposed correspondingly to the emitting area EA of the first sub-pixel R-SP, the second color filter pattern 108g (shown in FIG. 2) may be disposed correspondingly to the emitting area EA of the second sub-pixel G-SP and the third color filter pattern 108b (shown in FIG. 2) may be disposed correspondingly to the emitting area EA of the third sub-pixel B-SP. The first color filter pattern 108r (shown in FIG. 2) may be a red color filter pattern, the second color filter pattern 108g (shown in FIG. 2) may be a green color filter pattern and the third color filter pattern 108b (shown in FIG. 2) may be a blue color filter pattern. The color filter pattern may be omitted in the emitting area EA of the fourth sub-pixel W-SP.

The light emitting display device 100 includes a color conversion pattern 200 of a grid shape arranged over the first electrode 111 (shown in FIG. 2) within the emitting area EA of at least one of the first and second sub-pixels R-SP and G-SP. The color conversion pattern 200 may be further arranged adjacently to the bank 119 and/or may be extended from the bank 119 (shown in FIG. 2). The color conversion pattern 200 includes color conversion material.

The light emitting display device 100 including the color conversion pattern 200 improves color realization properties implemented from each of the sub-pixels R-SP, W-SP, B-SP and G-SP so that the light emitting display device 100 can improve its color gamut and the electro-luminescence element E (shown in FIG. 2) disposed in each of the sub-pixels R-SP, W-SP, B-SP and G-SP can also improve its luminous or light efficiency, respectively.

Figure 3:
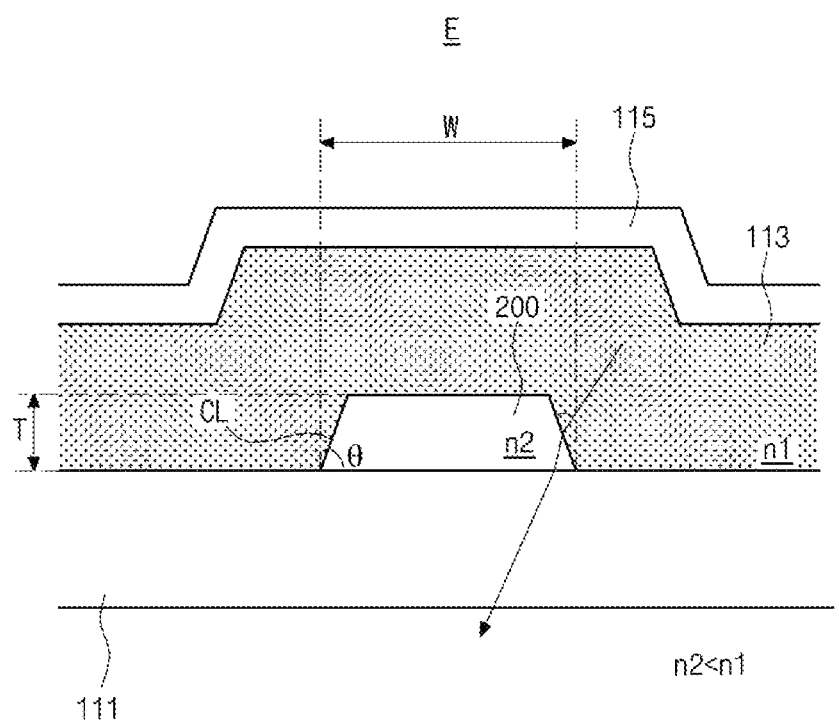
FIG. 3 is a schematic diagram illustrating the out-coupling occurred by a color conversion pattern arranged in the light emitting display device according to an exemplary aspect of the present disclosure.
Figure 4:
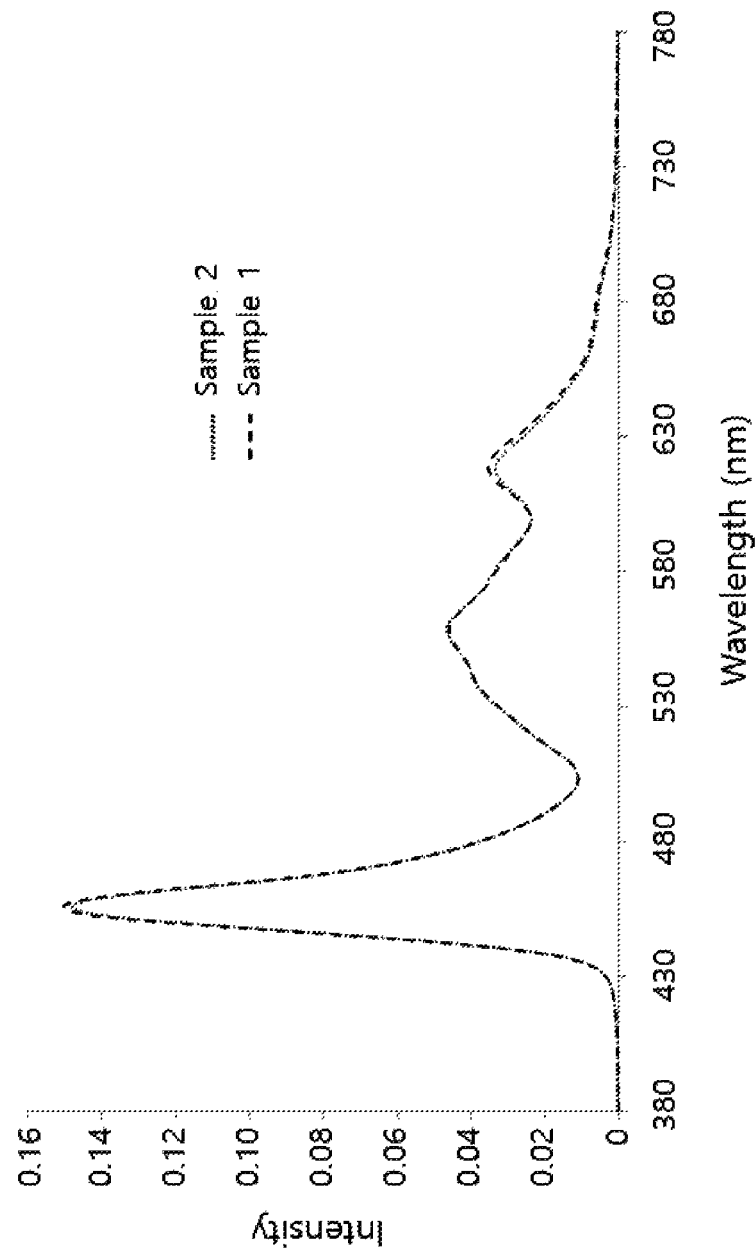
FIG. 4 is a graph comparing the emission intensity of white light in accordance with the inclination angle formed by the inclined surface of the color conversion pattern.
Figure 5:
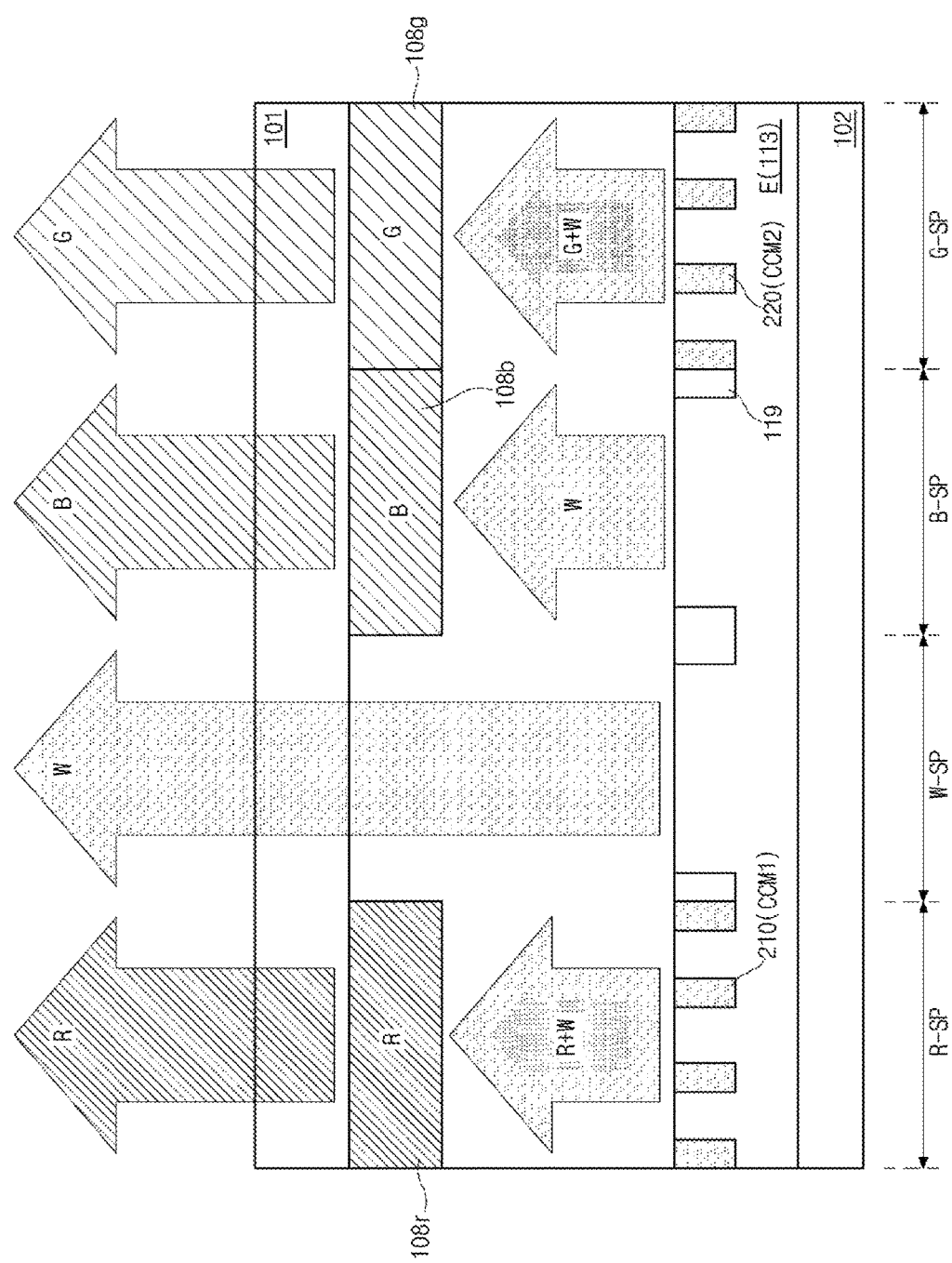
FIG. 5 is a schematic diagram illustrating a light propagation path in the light emitting display device in accordance with an exemplary aspect of the present disclosure.

FIG. 2 is a cross-sectional view taken along the line II-II' of FIG. 1 and illustrating the structure of a unit pixel including four sub-pixels in the light emitting display device in accordance with an exemplary aspect of the present disclosure. FIG. 3 is a schematic diagram illustrating the out-coupling occurred by a color conversion pattern arranged in the light emitting display device according to an exemplary aspect of the present disclosure. FIG. 4 is a graph comparing the emission intensity of white light in accordance with the inclination angle formed by the inclined surface of the color conversion pattern. FIG. 5 is a schematic diagram illustrating a light propagation path in the light emitting display device in accordance with an exemplary aspect of the present disclosure.

With referring to FIG. 2, the unit pixel P includes the first to fourth sub-pixels R-SP, G-SP, B-SP and W-SP. Each of the first to fourth sub-pixels R-SP, G-SP, B-SP and W-SP may be the red, green, blue and white sub-pixels, respectively. Each of the sub-pixels R-SP, W-SP, B-SP and G-SP includes the emitting area EA, respectively, and the bank 119 is disposed along the periphery of each emitting area EA to define the non-emitting area NEA in each sub-pixel.

The semiconductor layer 103 is disposed correspondingly to a switching area TrA of the non-emitting area NEA in each of the sub-pixels R-SP, W-SP, B-SP and G-SP. The semiconductor layer 103 may be made of silicon, and includes an active region 103a forming a channel in the central region, and source and drain regions 103b and 103c defined at both sides of the active region 103a and doped with high concentration of impurity.

A gate insulating layer 105 is disposed over the semiconductor layer 103. The gate electrode DG and the gate line GL (shown in FIG. 1) extending to one direction from the gate electrode DG are disposed correspondingly to the active area 103a of the semiconductor layer 103 over the gate insulating layer 105.

A first interlayer insulating layer 109a is disposed over the gate electrode DG and the gate line GL (shown in FIG. 1). The first interlayer insulating layer 109a and the gate insulating layer 105 includes a first and second semiconductor contact holes 116a and 116b each of which exposes the source and drain regions 103b and 103c, respectively, defined at both sides of the active region 103a.

Source and drain electrodes DS and DD, each of which contacts with the source and drain regions 103b and 103c exposed through the first and second semiconductor contact holes 116a and 116b, are disposed spaced apart from each other over the first interlayer insulating layer 109a including the first and second semiconductor contact holes 116a and 116b. A second interlayer insulating layer 109b is disposed over the source and drain electrodes DS and DD and the first interlayer insulating layer 109a exposed between those two electrodes DS and DD.

The source and drain electrodes DS and DD, the semiconductor layer 103 including the source and drain regions 103b and 103c each of which contacts to the electrodes DS and DD, the gate insulting layer 105 over the semiconductor layer 105 and the gate electrode DG constitute the driving thin film transistor DTr.

The switching thin film transistor STr (shown in FIG. 1) may have the same structure as the driving thin film transistor DTr and is connected to the driving thin film transistor DTr.

FIG. 2 illustrates a top-gate type thin film transistor DTr in which the semiconductor layer 103 is made of polysilicon or oxide and the gate electrode DG is disposed over the semiconductor layer 103. Alternatively, the driving thin film transistor DTr may have a bottom-gate type structure in which the semiconductor layer is made of pure of impure amorphous silicon and the gate electrode is disposed under the semiconductor layer. When the semiconductor layer 103 is made of oxide semiconductor material, a light-shield layer may be disposed under the semiconductor layer and a buffer layer may be further disposed between the light-shield layer and the semiconductor layer 103.

The color filter layer 108 is disposed correspondingly to the emitting area EA in each of the first to third sub-pixels R-SP, G-SP and B-SP over the second interlayer insulating layer 109b. The color filter layer 108 includes a first color filter pattern 108r, which may be the red color filter pattern, disposed correspondingly to the emitting area EA of the first sub-pixel R-SP, which may be the red sub-pixel, a second color filter pattern 108g, which may be the green color filter pattern, disposed correspondingly to the emitting area EA of the second sub-pixel G-SP, which may be the green sub-pixel, and a third color filter pattern 108b, which may be the blue color filter pattern, disposed correspondingly to the emitting area EA of the third sub-pixel B-SP, which may be the blue sub-pixel. Color filter pattern may not be disposed correspondingly to the emitting area EA of the fourth sub-pixel W-SP which may be the white sub-pixel.

The first color filter pattern 108r includes red pigment and/or red dye so that the first color filter pattern 108r can absorb blue to green wavelengths light and transmit red wavelength light among the white light emitted from the electro-luminescence element EL disposed in the first sub-pixel R-SP. The second color filter pattern 108g includes green pigment and/or green dye so that the second color filter pattern 108g can absorb the red wavelength light and blue wavelength light and transmit the green wavelength light among the white light emitted from the electro-luminescence element EL disposed in the second sub-pixel G-SP. The third color filter pattern 108b includes blue pigment and/or blue dye so that the third color filter pattern 108b can absorb light green to red wavelengths light and transmit the blue wavelength light among the white light emitted from the electro-luminescence element EL disposed in the third sub-pixel B-SP.

Accordingly, each of the sub-pixel R-SP, G-SP, B-SP and W-SP of the light emitting display device 100 emits red light, green light, blue light and white light, respectively, so that the light emitting display device 100 can implement full color with high luminance.

An over-coating layer 106 is disposed over the color filter layer 108. The over-coating layer 106 includes a drain contact hole PH exposing the drain electrode DD through the second interlayer insulating layer 109b.

The first electrode 111, which may be the anode electrode, is disposed over the over-coating layer 106. The first electrode 111 is connected to the drain electrode D of the driving thin film transistor DTr and may include material having a relatively high work function value to form the anode electrode of the electro-luminescence element E.

The first electrode 111 may be located separately in each of the sub-pixels R-SP, W-SP, B-SP and G-SP. The bank 119 is disposed between the first electrodes 111 disposed in each of the sub-pixels R-SP, W-SP, B-SP and G-SP. The bank 119 is formed to cover an end of the first electrode 111 on the over-coating layer 106. Using the bank 119 as a boundary for each of the sub-pixels R-SP, W-SP, B-SP and G-SP, the first electrode 111 has a structure separated for each of the sub-pixels R-SP, W-SP, B-SP and G-SP.

The emissive layer 113 is disposed over the first electrode 111 and the bank 119. In one exemplary aspect, the emissive layer 113 may include an emitting material layer (EML) including luminous material. In one exemplary aspect, the EML may include an organic emitter. For example, the EML may include at least one host and a dopant. The dopant may include fluorescent material, phosphorescent material and/or delayed fluorescent material.

Alternatively, the EML may include an inorganic luminous material such as quantum-dots (QDs) and/or quantum-rods (QRs) particles. The quantum-dot and the quantum-rod may be selected from, but is not limited to, Group II-VI semiconductor material, Group III-V semiconductor material, Group IV-VI semiconductor material, Group IV material and combination thereof. The quantum-dot and the quantum-rod may have a core-shell structure. The quantum-dot and the quantum-rod may have the same structure as the color conversion material as described below.

The emissive layer 113 may include a hole transport layer (HTL) disposed between the first electrode 111 and the EML and/or an electron transport layer (ETL) disposed between the EML and the second electrode 115. The emissive layer 113 may further include a hole injection layer (HIL) disposed between the first electrode 111 and the HTL and/or an electron injection layer (EIL) disposed between the ETL and the second electrode 115. Optionally, the emissive layer 113 may further include an electron blocking layer (EBL) disposed between the HTL and the EML and/or a hole blocking layer (HBL) disposed between the EML and the ETL.

The emissive layer 113 may include a single emitting part or may include a plurality of emitting parts to form a tandem structure. When the emissive layer include a plurality of emitting parts, the emissive layer may further includes a charge generation layer (CGL) disposed between adjacent emitting parts. The emissive layer 113 in each of the sub-pixels R-SP, W-SP, B-SP and G-SP emits white light.

The second electrode 115, which may be the cathode electrode, is disposed over the emissive layer. The second electrode 115 may be made of material having relatively low work function.

In the light emitting display device 100, when a predetermined voltage is applied to the first electrode 111 and the second electrode 115 by selected signals, the holes injected from the first electrode 111 and electrons injected from the second electrode 115 are transported to the emissive layer 113 to form excitons, and when those excitons are transferred from an excited state to a ground state, the emissive layer 113 generates and emits light in the form of visible light.

As an example, the light emitting display device 100 may have a bottom-emission type in which the light emitted from the emissive layer 113 directs outwardly through the first electrode 111. In this case, the second electrode 115 may further include a reflective layer that may be made of opaque conductive material. For example, the reflective layer may be made of aluminum-palladium-copper (APC) alloy, and the second electrode 115 may have a triple-layered structure of ITO/APC/ITO.

The first electrode 111 may have a relative thin thickness to transmit the light emitted from the emissive layer 113. For example, the light transmittance of the first electrode 111 may be about 45-50%. As an example, the first electrode 111 may be made of, but is not limited to, metal oxide such as indium-tin-oxide (ITO) and/or indium-zinc oxide (IZO); a mixture of metal and oxide such as ZnO:Al and $SnO_2$:Sb; a conductive polymer such as poly(3-methylthiophene), poly [3,4-(ethylene-1-2-dioxy)thiophene] (PEDOT), polypyrrole (PPy) and/or polyaniline (PANI); carbon nano tube (CNT), graphene, silver nano wire, and the like.

A protection film 102 of a thin film type is disposed on the driving thin film transistor DTr and the electro-luminescence element E so that the light emitting display device 100 may be encapsulated through the protection film 102.

In one exemplary aspect, the protection film 102 may have at least two laminated inorganic protection film for preventing external oxygen and moisture from being penetrated into the electro-luminescence film, and optionally an organic protection film between two inorganic protection films may be intervened for supplement shock resistances of the protection film 102.

In such laminated structures of alternately disposed organic protection film and inorganic protection film, the inorganic protection film may enclose the whole organic protection film in order to prevent the moisture and oxygen from being penetrated through the sides of the organic protection film. In this case, it is possible to prevent external moisture and oxygen from being penetrated in the light emitting display device 100

The light emitting display device 100 further includes a color conversion pattern 200 located between the first electrode 111 and the emissive layer 113 corresponding to the emitting area EA of the at least one sub-pixel. For example, the color conversion pattern 200 may be disposed corresponding to each of the emitting area EA in the first sub-pixel R-SP and/or the second sub-pixel G-SP.

A plurality of the color conversion pattern 200 may be disposed with space apart from each other. Alternatively, each of the color conversion patterns 200 may include an inclined surface CL at both sides as illustrated in FIG. 3. The inclined surface CL of the color conversion pattern 200 adjusts the path of light when the light progresses from a denser medium to a rarer medium, and prevents an internal total reflection from occurring, so the inclined surface CL can improve out-coupling efficiency of the light.

More particularly, the color conversion pattern 200 forms the oblique inclined surface CL whose cross section forms a predetermined inclination angle? with respect to the top surface of the substrate 101 or the first electrode 111 with an upwardly tapering width W. The color conversion pattern 200 may be made of organic material having a reflective index equal to or less than about 1.6 such as photo acryl-based material, while the emissive layer is made of organic or inorganic material having a refractive index equal to or more than about 1.8. As the light emitted from the emissive layer 113 is incident from the denser medium to the rarer medium in the course of being incident to the color conversion pattern 200, the incident angle above the critical angle may be lost due to total internal reflection.

However, the light color conversion pattern 200 of the light emitting display device includes the inclined surface CL. The light emitted from the emissive layer 113 is refracted close to the normal when passing through the inclined surface CL, and the inclined surface CL is also inclined at the predetermined angle?, so that when the light is incident on the color conversion pattern 220, the incident angle does not exceed the critical angle, and therefore, total internal reflection does not occur.

Accordingly, it is possible to minimize the loss of the light although the light passes from the denser medium to the rarer medium, and the problem that the light emitted from the emissive layer 113 does not come out to the outside and is trapped inside is reduced. Therefore, as the light extraction efficiency in the sub-pixels R-SP, W-SP, B-SP and G-SP is improved, out-coupling efficiency in the light emitting display device 100 can be enhanced.

In one exemplary aspect, the inclined surface CL of the color conversion pattern 200 may have the inclination angle θ of an acute angle greater than 0° and less than 900 with respect to the top surface of the substrate 101 or the first electrode 111. The inclination angle θ may be determined such that the emissive layer 113 may be formed on the first electrode 111 without disconnection and/or short circuit.

As an example, the inclined surface CL of the color conversion pattern 200 may have the inclination angle θ of equal to or less than about 40°. When the inclined surface CL has the inclination angle θ of equal to or more than about 40°, the disconnection and/or short circuit of the emissive layer 113 may occur at a portion where the emissive layer 113 is in contact with the inclined surface CL. Accordingly, the inclined surface CL of the color conversion pattern 200 may have the inclination angle θ of equal to or less than about 40° with respect to the substrate 101.

With referring to FIG. 4, in which horizontal axis indicates a wavelength and vertical axis indicates luminescence intensity. The luminescence intensity is a numerical value expressed as a relative value based upon maximum value of the EL (Electroluminescence) spectrum. In FIG. 4, the sample 1 was designed that the inclined surface CL of the color conversion pattern 200 has the inclination angle of 30°, while the sample 2 was designed that the inclined surface CL of the color conversion pattern 200 has the inclination angle of 34°. It was confirmed that the while light has different luminescence intensity although the inclined surface CL of the color conversion pattern 200 has the inclination angle only by 4° difference.

Accordingly, it can be confirmed that the inclination angle formed by the inclined surface CL of the color conversion pattern 200 affect the light extraction efficiency of the light emitting display device 100. In addition, the emissive layer 113 positioned above the color conversion pattern 200 is disposed along the morphology of the color conversion pattern 200 as it is, that is, the emissive layer 113 is positioned and formed along the surface shapes of the first electrode 111 and the color conversion pattern 200. In this case, as the emission area of the emissive layer 113 becomes wider, the light amount emitted from the emissive layer 113 increases, and thus, the light extraction efficiency in the emissive layer can be enhanced.

Particularly, the color conversion pattern 200 includes color conversion material (CCM) so that the emissive layer 113 can improve color implementation properties in each of the sub-pixels R-SP, W-SP, B-SP and G-SP and the optical or out-coupling efficiency of the electro-luminescence element E disposed in each of the sub-pixels R-SP, W-SP, B-SP and G-SP.

With referring to FIG. 5, the color conversion material included in the color conversion pattern 200 converts and the short-wavelength light into the long-wavelength light to be emitted. A first color conversion pattern 210 is disposed corresponding to the emitting area EA of the first sub-pixel R-SP as the red sub-pixel among the sub-pixels R-SP, W-SP, B-SP and G-SP. The first color conversion pattern 210 acts as emitting a second color light emitted from the emissive layer 113. As an example, the first color conversion pattern 210 may be a layer converting a first color light emitted from the emissive layer 113 to the second color light.

More particularly, the first color light may be blue light having a wavelength between about 450 nm and about 470 nm and/or green light having a wavelength between about 495 nm and about 570 nm, and the second color light may be red right having a wavelength between about 620 nm and about 750 nm, but is not limited thereto. It is to be understood that the red color light includes any red light having the wavelength ranges recognized as red color light in the relevant art.

A second color conversion pattern 220 may be disposed corresponding to the emitting area EA of the second pixel G-SP as the green sub-pixel. For example, the second color conversion pattern 220 acts as emitting a third color light emitted from the emissive layer 113. As an example, the second color conversion pattern 220 may be a layer converting a first color light emitted from the emissive layer 113 to the third color light.

More particularly, the first color light may be blue light having a wavelength between about 450 nm and about 470 nm, and the third color light may be green light having a wavelength between about 495 nm and about 570 nm, but is not limited thereto. It is to be understood that the green color light includes any green light having wavelength ranges recognized as green color light in the relevant art.

Accordingly, since the first color conversion pattern 210 positioned to correspond to the first sub-pixel R-SP converts the blue B and/or green G light among the white light W emitted from the emissive layer 113 and incident on the first sub-pixel R-SP into the red light R, the efficiency of the red light is increased.

In addition, since the second color conversion pattern 220 positioned to correspond to the second sub-pixel G-SP converts the blue light B among the white light W emitted from the emissive layer 113 and incident on the second sub-pixel G-SP into the red light G, the efficiency of the green light is also increased.

Particularly, as the first color conversion pattern 210 converts the blue and/or green light into the red light R of high color purity having the wavelength between about 620 nm and about 750 nm, it is possible to implement high purity red light R in the first sub-pixel R-SP. In addition, as the second color conversion pattern 220 converts the blue light into the green light G of high purity having the wavelength between about 495 nm and about 570 nm, it is possible to implement high purity green light G in the second sub-pixel G-SP. In other words, it is possible to output red light R and green light G having improved color purity and optical efficiency in the light emitting display device 100 in accordance with the present disclosure.

The while light W from the emissive layer 113 is emitted in each of the third sub-pixel W-SP as the white sub-pixel and the fourth sub-pixel B-SP as the blue sub-pixel, and then the white light W outputs outwardly passing through the substrate 101 in the third sub-pixel W-SP and the white light W emitted from the emissive layer 113 is converted into blue light B as passing through the blue color filter pattern 108b so that the blue light B output outwardly to the substrate 101 in the fourth sub-pixel B-SP.

The blue light B and/or the green light G among the white light W emitted from the emissive layer 113 is converted into the red light R by the first color conversion pattern 210 in the first sub-pixel R-SP, and then the white light W and the red light R with high color purity are incident on the red color filter pattern 108r in the first sub-pixel R-SP. The admixed white light W and the red light R incident on the red color filter pattern 108r are further converted into the red light R with much higher color purity in the course of passing through the red color filter pattern 108r, and then the red light R with much higher color purity outputs outwardly to the substrate 101 to implement red light R with much higher color purity.

In addition, the blue light B among the white light W emitted from the emissive layer 113 is converted into the green light G with high color purity by the second color conversion pattern 220 in the second sub-pixel G-SP, and then the white light W and the green light G with high color purity are passed through the green color filter pattern 108G. As the admixed white light W and the green light G passing through the green color filter pattern 108 are further converted into the green light with much higher color purity, and then the green light G with much higher color purity outputs outwardly to the substrate 101 to implement green light G with much higher color purity.

As an example, the color conversion material (CGM) include in the first and second color conversion patterns 210 and 220 may include, but is not limited to, quantum dot (QD), fluorescent dye and combination thereof. The fluorescent dye may include organic fluorescent material, inorganic fluorescent material and combination thereof.

As an example, the quantum dot may be selected from, but is not limited to, Group II-VI compound, Group III-V compound, Group IV-VI compound, Group IV element, Group IV compound and combination thereof. Particularly, the first color conversion pattern 210 includes red quantum dot and the second color conversion pattern 220 includes green quantum dot.

For example, Group II-VI compound may include, but is not limited to, a diatomic compound selected from CdSe, CdTe, ZnS, ZnSe, ZnTe, ZnO, HgS, HgSe, HgTe, MgSe, MgS and combination thereof, a triatomic compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and combination thereof, and/or a tetraatomic compound selected from HgZnTeS, CdZnSeS, CdZnSeTe, CdZnSTe, CdHgSeS, CdHgSeTe, CdHgSTe, HgZnSeS, HgZnSeTe, HgZnSTe and combination thereof.

The Group III-V compound may include, but is not limited to, a diatomc compound selected from GaN, GaP, GaAs, GaSb, AlN, AlP, AlAs, AlSb, InN, InP, InAS, InSb and combination thereof, a triatomic compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP and combination thereof, and/or a tetraatomic compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and combination thereof.

The Group IV-VI compound may include, but is not limited to, a diatomic compound selected from SnS, SnSe, SnTe, PbS, PbSe, PbTe and combination thereof, and/or a tetraatomic compound selected from SnPbSSe, SnPbSeTe, SnPbSTe and combination thereof. The Group IV element may be selected from, but is not limited to, Si, Ge and combination thereof. The Group IV compound may include, but is not limited to, a diatomic compound selected from SiC, SiGe and combination thereof.

Each of the diatomic compound, the triatomic compound and the tetraatomic compound may be independently present in particles with equivalent concentration or in the same particle as concentration distribution is partially divided into different states. Alternatively, the quantum dot may have a heterologous structure including at least one core and at least one shell enclosing the core.

FIG. 4 is a graph comparing the emission intensity of white light in accordance with the inclination angle formed by the inclined surface of the color conversion pattern. The interface between the core and the shell may have a concentration gradient in which the concentration of an element present in the shell decreases toward the center.

In one exemplary aspect, the quantum dot may have photoluminescence spectrum with a full width of half maximum (FWHM) equal to or less than about 45 nm, for example about 40 nm or about 30 nm, so that it can improve its color purity and color reproducibility. In addition, as the light emitted from the quantum dot is directed to whole directions, the viewing angle of the light can be further improved.

The quantum dot may have any shape and is not limited to a particular shape. For example, the quantum dot may be a nano particle, a nano tube, a nano wire, a nano fiber, a nano plate-shape particle, and the like each of which may have independently a spherical shape, a pyramid shape, a multi-arm shape or a cubic shape, respectively.

The fluorescent dye may include red fluorescent dye, green fluorescent dye, other fluorescent dye emitting a third color and combination thereof. The red fluorescent dye may be material absorbing green wavelength light and emitting red wavelength light, and may include, but is not limited to, (Ca, Sr and/or Ba)S, (Ca, Sr and/or Ba)$_2$Si$_5$Ns, CaAlSiN$_3$, CaMoO$_4$, Eu$_2$Si$_5$N$_8$ and combination thereof. Optionally, the red fluorescent dye may have a maximum photoluminescence (PL) peak between about 617 nm and about 637 nm and FWHM between about 40 nm and about 50 nm. More particularly, the red fluorescent dye may have a maximum PL peak of about 627 nm and FWHM about 44 nm, but is not limited thereto.

The green fluorescent dye may be material absorbing blue wavelength light and emitting green wavelength light, and may include, but is not limited to, yttrium aluminum garnet (YAG), (Ca, Sr and/or Ba)$_2$SiO$_4$, barium-magnesium-aluminate (BAM), α-SiAlON, β-SiAlON, Ca$_3$Sc$_2$Si$_3$O$_{12}$, Tb$_3$Al$_5$O$_{12}$, BaSiO$_4$, CaAlSiON, (Sr$_{1-x}$Ba$_x$)Si$_2$O$_2$N$_2$ (0<x<1) and combination thereof. Optionally, the green fluorescent dye may have a maximum PL peak between about 510 nm and about 525 nm and FWHM between about 60 nm and about 70 nm. More particularly, the green fluorescent dye may include a first green fluorescent dye with a maximum PL peak of about 520 nm and a FWHM of about 62 nm and a second green fluorescent dye with a maximum PL peak of 511 nm and a FWHM of about 64 nm, but is not limited thereto.

The light emitting display device 100 includes the color conversion pattern 200 including the color conversion material corresponding to the emitting area EA of the first sub-pixel R-SP, and optionally, the second sub-pixel G-SP, so that the white light W emitted from the emissive layer 113 does not trapped inside, but come out by the color conversion pattern 200. Since the light extraction efficiency in the sub-pixels R-SP, G-SP, W-SP and B-SP is improved, the out-coupling efficiency in the device 100 can be greatly improved. In addition, it is possible to implement red light R and/or green light G with improved color purity and optical efficiency by the color conversion material included in the color conversion pattern 200.

As the thickness T of the color conversion pattern 200 increases, much white light W emitted from the emissive layer 113 can be incident into the color conversion pattern 200, and thereby further improving the color conversion effect. On the contrary, as the thickness T of the color conversion pattern 200 increases, holes are not transferred to the emissive layer in the region where the color conversion pattern 200 is formed because the distance between the first electrode 111 as an anode electrode and the emissive layer 113 increases. Accordingly, the region where the color conversion pattern 200 having a thick thickness T is formed may form a non-emission area where the light is not substantially emitted from the emissive layer 113.

As an example, the color conversion layer 200 may have, but is not limited to, a thickness T between about 0.5 um and about 1.5 um. When the thickness T of the color conversion pattern 200 is less than about 0.5 um, it is difficult to realize the improvement of the light extraction efficiency by the color conversion pattern 200. On the contrary, when the thickness T of the color conversion pattern 200 is more than about 1.5 um, it is difficult for the emissive layer 113 to emit light in the region where the color conversion pattern 200 is formed.

Alternatively, the color conversion pattern 200 may have, but is not limited to, a width W between about 1 um and about 3 um. When the width W of the color conversion pattern 200 is more than about 3 um, the non-emission area due to the color conversion pattern 200 increases, which may affect the luminance of the light emitting display device 100.

TABLE 1

Luminance by the number of color conversion pattern

| Luminance | | Number of color conversion pattern | | | |
|---|---|---|---|---|---|
| Change Rate | | 1 | 2 | 3 | 4 |
| Thickness | 0.5 um | 4.7% | 5.0% | 6.3% | 3.4% |
| | 1 um | 4.7% | 6.0% | 5.0% | 4.1% |
| | 1.5 um | 4.7% | 5.5% | 5.6% | 1.9% |

The Table 1 indicates an experimental result measuring the luminance change rates by the number of the color conversion pattern 200, the color conversion pattern 200 having a width W of 3 um were spaced apart from 15 to 20 um each other and then the luminance of the device was measured. As indicated in Table 1, when the luminance of the organic light emitting display device without the color conversion patter is 100%, it can be seen that the luminance of the device is increased by 4.7% when only one color conversion pattern with a width W of 3 um is provide. In addition, it can be seen that the maximum luminance of the device is further increased by 6.3% when three color conversion patterns 200 are provided compared to luminance of the device without the color conversion pattern.

However, when the device includes four color conversion patterns 200, the luminance change rate is rather lower than the device including two or three color conversion patterns 200. These results indicate that the luminance change rate is lower because the absorbed amount of light emitted from the emissive layer 113 is decreased when the area occupied by the color conversion pattern 200 is too large compared to the emitting area EA, as the color conversion material in the color conversion pattern 200 absorbs the light emitted from the emissive layer 113 and re-emits it, Also, the following Table 2 illustrates experimental results showing the area occupied by the color conversion pattern 200 by the number of the color conversion pattern 200 in Table 1, and the luminance change rate was measured by the area occupied by the color conversion pattern 200 in one sub-pixel R-SP, G-SP, W-SP or B-SP.

TABLE 2

Luminance by the area of color conversion pattern

| Luminance | | Area Ratio | | | |
|---|---|---|---|---|---|
| Change Rate | | 5% | 10% | 14% | 19% |
| Thickness | 0.5 um | 4.7% | 5.0% | 6.3% | 3.4% |
| | 1 um | 4.7% | 6.0% | 5.0% | 4.1% |
| | 1.5 um | 4.7% | 5.5% | 5.6% | 1.9% |

As indicated in Table 2, when the area occupied by the color conversion pattern 200 is 19%, the luminance charge ratio was rather decreased. On the other hand, when the area occupied by the color conversion pattern 200 compared to the area of the sub-pixel R-SP, G-SP, W-SP or B-SP is about 5% to about 15%, the luminance of the device can be further improved.

The following Table 3 illustrates experimental results comparing and measuring color coordinates of red light in the organic light emitting display device in accordance with an example of the present disclosure. In Table 3, Ref. indicates the color coordinates of red light of the organic light emitting display device without the color conversion pattern, Case 1 indicates the color coordinates of the red light R of the device where only one color conversion pattern 200 is disposed in the emitting area EA of the red sub-pixel R-SP, Case 2 indicate the color coordinates of the red light R of the device where two color conversion patterns 200 are disposed in the emitting areal EA of the red sub-pixel R-SP, and Case 3 indicate the color coordinates of the red light R of the device where three color conversion patterns 200 are disposed in the emitting area EA of the red sub-pixel R-SP. The color conversion patterns 200 in Case 1, Case 2 and Case 2 with W of 3 um were spaced apart from each other of 15 to 20 um, and then the luminance was measured.

TABLE 3

Red Color Coordinates Luminance

| Thickness | | Case 1 | | | Case 2 | | | Case 3 | | |
|---|---|---|---|---|---|---|---|---|---|---|
| T | Ref. | 0.5 um | 1 um | 1.5 um | 0.5 um | 1 um | 1.5 um | 0.5 um | 1 um | 1.5 um |
| x | 0.648 | 0.657 | 0.657 | 0.657 | 0.657 | 0.657 | 0.657 | 0.656 | 0.657 | 0.657 |
| y | 0.342 | 0.337 | 0.337 | 0.337 | 0.337 | 0.337 | 0.337 | 0.337 | 0.337 | 0.337 |
| Y | 2.282 | 2.389 | 2.389 | 2.389 | 2.396 | 2.419 | 2.408 | 2.426 | 2.397 | 2.411 |
| R | 0.0% | 4.7% | 4.7% | 4.7% | 5.0% | 6.0% | 5.5% | 6.3% | 5.0% | 5.6% |

Y: luminance; R: Luminance change ratio relative to Ref.

Before explaining the effect of improving color reproduction ratio of the experimental results, the color gamut indicates a figure (mainly a triangle) on the color coordinate system that shows the physical properties related to color expression of the device that acquires, processes and outputs images, and representative color gamuts include NTSC, BT.709, sRGB, Adobe RGD, DCI, BT.2000 and the like.

In addition, the color reproduction ratio (CRR) indicates a value expressed as a relative area ratio (%) to the reference color gamut, not expressed as an absolute value. In case of red light, it can be seen that the CRR is improved when the x-coordinates value in the color coordinate system in which the color gamut is defined is increased. In other words, the red light spectrum realizes higher purity as the x-coordinate value is improved.

As indicated in Table 3, it can be seen that the coordinate value CIExy of the red light in Ref is (0.648, 0.342), which differs from the target color coordinates CIExy (0.685, 0.314) of the red light spectrum in the emissive layer 113. In contrast, the x-coordinate values in Case 1, Case 2 and Case 3 were improved over the x-coordinate values in Ref. Particularly, the x-coordinate value in Case 1, Case 2 and Case 3 was improved to 0.657 compared to 0.648 in Ref., and were closer to the target color coordinate value CIExy (0.685, 0.314) of the red light spectrum.

In the device, the first color conversion pattern 210 is disposed correspondingly to the first sub-pixel R-SP, and optionally, the second color conversion pattern 220 is disposed correspondingly to the second sub-pixel G-SP. Accordingly, the light emitted from the emissive layer is not trapped inside and outputs outwardly by the color conversion pattern 200, and therefore, the light extraction efficiency in the sub-pixels R-SP, G-SP, W-SP and B-SP so that the out-coupling efficiency in the device can be further improved.

In addition, the blue light B and/or the green light G among the white light W emitted from the emissive layer 113 in the first sub-pixel R-SP is converted into the red light R by the first color conversion pattern 210, and/or the blue light B among the white light W emitted from the emissive layer 113 in the second sub-pixel G-SP is converted into the green light G by the second color conversion pattern 220. It is possible to implement the red light R and green light G with higher color purity and improved optical efficiency.

Optionally, the bank 119 positioned along the edge of the emitting area EA of the first and second sub-pixels R-SP and G-SP may be made of the same material as the color conversion pattern 200. In this case, the out-coupling efficiency can be further improved even through the edges of the first and second sub-pixels R-SP and G-SP, and therefore, it is possible to implement red light R and/or green light having much improved color purity and optical efficiency.

Optionally, the bank 119 disposed along the edge of the emitting area EA in each of the sub-pixels R-SP, G-SP, W-SP and B-SP may include a trench tr by which the bank 119 may be disposed separately in each of the plural sub-pixels R-SP, G-SP, W-SP and B-SP. In this case, some of the light emitted from the emissive layer 113 of the first sub-pixel R-SP is reflected at the interface between the red color filter pattern 108*d* and the second interlayer insulating layer 109*b* positioned below thereof, and then incident toward the adjacently disposed white sub-pixel W-SP. In this case, the light incident toward the white sub-pixel W-SP is blocked by the trench tr. Accordingly, color mixing of light emitted from the red sub-pixel R-SP and the light emitted from the adjacent white sub-pixel W-SP can be minimized by the trench tr.

Meanwhile, while the color conversion pattern 200 disposed corresponding to the emitting area EA of the red and green sub-pixels R-SP and G-SP is formed in a grid shape in the above. Alternatively, the color conversion pattern 200 may be formed of an edge pattern surrounding the edge of the emitting area EA and an island pattern each having an island shape in the emitting area EA. In this case, the island pattern may be formed in various shapes such as a circle, an ellipse, and a polygon in plan.

It will be apparent to those skilled in the art that various modifications and variations can be made in the present disclosure without departing from the scope of the disclosure. Thus, it is intended that the present disclosure cover the modifications and variations of the present disclosure provided they come within the scope of the appended claims.

What is claimed is:

1. A light emitting display device including:
   a first sub-pixel, a second sub-pixel and a third sub-pixel each of which includes an emitting area and a non-emitting area defined in a substrate;
   a first electrode disposed over the substrate;
   a bank covering an edge of the first electrode and disposed along a periphery of the emitting area;

a first color conversion pattern located correspondingly to the emitting area of the first sub-pixel;

an emissive layer disposed over the bank and the first color conversion pattern; and a second electrode disposed over the emissive layer, wherein the first color conversion pattern is arranged in a transmission direction of light emitted from the emissive layer in the first sub-pixel and converts a first color light among the light emitted from the emissive layer in the first sub-pixel to a second color light, and wherein the first color conversion pattern is arranged in a grid shape in the emitting area of the first sub-pixel.

2. The light emitting display device of claim 1, wherein the first color conversion pattern is disposed along a periphery of the emitting area of the first sub-pixel.

3. The light emitting display device of claim 1, wherein the first color conversion pattern has an area of about 5% to about 15% of the emitting area of the first sub-pixel.

4. The light emitting display device of claim 1, wherein the first color conversion pattern has a thickness of about 0.5 um to about 1.5 um.

5. The light emitting display device of claim 1, wherein the first color conversion pattern has a width of about 1 um to about 3 um.

6. The light emitting display device of claim 1, wherein the first sub-pixel further includes a first color filter pattern.

7. The light emitting display device of claim 6, wherein the first color filter pattern includes a red color filter pattern.

8. The light emitting display device of claim 7, wherein the first color light is at least one of a blue light and a green light and the second color light is a red light.

9. The light emitting display device of claim 8, wherein the red light is incident to the red color filter pattern.

10. The light emitting display device of claim 1, wherein the light emitting display device further includes a second color conversion pattern located correspondingly to the emitting area of the second sub-pixel.

11. The light emitting display device of claim 10, wherein the second color conversion pattern is located in a transmission direction of a light emitted from the emissive layer in the second sub-pixel.

12. The light emitting display device of claim 11, wherein the second color conversion pattern converts the first color light emitted from the emissive layer of the second sub-pixel to a third color light.

13. The light emitting display device of claim 12, wherein the second sub-pixel further includes a second color filter pattern.

14. The light emitting display device of claim 13, wherein the second color filter pattern includes a green color filter pattern.

15. The light emitting display device of claim 14, wherein the first color light is a blue light and the third color light is a green light.

16. The light emitting display device of claim 15, wherein the green light is incident to the green color filter pattern.

17. The light emitting display device of claim 10, wherein the second color conversion pattern is arranged in a grid shape in the emitting area of the second sub-pixel.

18. The light emitting display device of claim 1, wherein the first color conversion pattern includes an inclined surface changing a propagation path of the light emitted from the emissive layer in the first sub-pixel when the light is incident to the first color conversion pattern.

19. The light emitting display device of claim 18, wherein the inclined surface has an inclination angle greater than 0 degrees and less than 40 degrees.

20. The light emitting display device of claim 1, wherein the bank includes a trench.

* * * * *